(12) United States Patent
Yen et al.

(10) Patent No.: US 6,751,882 B1
(45) Date of Patent: Jun. 22, 2004

(54) MECHANISM FOR POSITIONING A SUBSTRATE OF AN IMAGE SENSOR

(75) Inventors: Pang-Chieh Yen, Hsinchu Hsien (TW); Jen-Te Huang, Hsinchu Hsien (TW); Yves Huang, Hsinchu Hsien (TW); Tanja Liu, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 0 days.

(21) Appl. No.: 10/384,920

(22) Filed: Mar. 5, 2003

(51) Int. Cl.[7] ............................................. G01D 21/00
(52) U.S. Cl. ..................... 33/645; 33/613; 414/935; 414/940
(58) Field of Search ............ 33/613, 645; 414/935–941

(56) References Cited

U.S. PATENT DOCUMENTS 6,077,026 A * 6/2000 Shultz ..................... 414/744.1

2003/0091291 A1 * 5/2003 Keo et al. ..................... 385/52

* cited by examiner

Primary Examiner—Christopher W. Fulton
Assistant Examiner—Yaritza Guadalupe
(74) Attorney, Agent, or Firm—Pro-Techtor International Services

(57) ABSTRACT

A mechanism for positioning a substrate of an image sensor. The substrate has first to fourth edges. The mechanism includes a standard unit, a link unit, and a push-up needle unit. The standard unit has adjacent first and second standard planes, both of which define a positioning region for receiving the substrate. The first and second edges contact the first and second standard planes, respectively. The link unit includes a first link and a second link pivotally mounted to the first link at a pivotal portion for positioning the third edge of the substrate. The push-up needle unit positions the fourth edge. When the link unit operates, the push-up needle unit and the pivotal portion of the link unit are moved toward the fourth edge and the third edge of the substrate, respectively, to position the substrate.

5 Claims, 5 Drawing Sheets

MECHANISM FOR POSITIONING A SUBSTRATE OF AN IMAGE SENSOR

BACKGROUND OF THE INVENTION

1. Field of the Invention

The invention relates to a mechanism for positioning a substrate of an image sensor, and in particular to a mechanism for precisely aligning a photosensitive chip with a substrate so as to increase the production yield.

2. Description of the Related Art

Referring to FIG. 1, a conventional image sensor includes a substrate 10, a frame layer 18, a photosensitive chip 26, a plurality of wires 28, and a transparent layer 34. The substrate 10 has a first surface 12 on which a plurality of signal input terminals 15 is formed, and a second surface 14 on which a plurality of signal output terminals 16 is formed. The frame layer 18 has an upper surface 20 and a lower surface 22 adhered to the first surface 12 of the substrate 10 to form a chamber 24 together with the substrate 10. The photosensitive chip 26 is arranged within the chamber 24 and is mounted to the first surface 12 of the substrate 10. Each wire 28 has a first terminal 30 and a second terminal 32. The first terminals 30 are electrically connected to the photosensitive chip 26, and the second terminals 32 are electrically connected to the signal input terminals 15 of the substrate 10. The transparent layer 34 is adhered to the upper surface 20 of the frame layer 18.

In order to finish the above-mentioned package processes, the substrate 10 has to be precisely positioned and then the frame layer 18 and the photosensitive chip 26 are fixed to a fixed position of the first surface 12 of the substrate 10. If the substrate 10 is not well positioned, the frame layer 18 and the photosensitive chip 26 cannot be precisely mounted to the substrate 10. Therefore, the photosensitive chip 26 cannot correctly and completely receive image signals and the quality of the image sensor is influenced.

Referring to FIG. 2, a conventional mechanism for positioning a substrate of an image sensor includes a first push-up needle unit 40, a second push-up needle unit 41, a first link unit 42 and a second link unit 43 to position a first edge 44, a second edge 45, a third edge 46 and a fourth edge 47 of the substrate 10. The first push-up needle unit 40 is arranged at the first edge 44 of the substrate 10 and has a first link 48 and two first push-up needles 49 to push the first edge 44 of the substrate 10. The second push-up needle unit 41 is arranged at the second edge 45 of the substrate 10 and has a second link 50 and a second push-up needle 52 to push the second edge 45 of the substrate 10. The first link unit 42 is arranged at the third edge 46 of the substrate 10 and has a third link 53 and a fourth link 54 pivotally mounted to the third link 53. A first cam 55 is mounted to a pivotal position between a first end of the fourth link 54 and a first end of the third link 53 in order to push the third edge 46 of the substrate 10. A second end of the third link 53 and a second end of the fourth link 54 are pivotally mounted to the first link 48 and the second link 50, respectively. The second link unit 43 is arranged at the fourth edge 47 of the substrate 10 and has a fifth link 56 and a sixth link 57 pivotally mounted to the fifth link 56. A second cam 58 is mounted to a pivotal position between a first end of the fifth link 56 and a first end of the sixth link 57 in order to push the fourth edge 47 of the substrate 10. A second end of the fifth link 56 and a second end of the sixth link 57 are pivotally mounted to the first link 48 and the second link 50, respectively.

As shown in FIG. 3, when the positioning mechanism of the invention operates, it moves toward the four edges of the substrate 10 so that the first push-up needles 49, the second push-up needle 52, the first cam 55 and the second cam 58 push the first edge 44, the second edge 45, the third edge 46 and the fourth edge 47 of the substrate 10, respectively. Consequently, the substrate 10 is positioned.

Then, it is possible to precisely align the frame layer 18 and the photosensitive chip 26 with the substrate 10.

However, the first push-up needles 49, the second push-up needle 52, the first cam 55 and the second cam 58 are driven toward the four edges of the substrate 10. At this time, when there are some deviations in the mechanism, the position of the substrate 10 is deviated and the frame layer 18 and the photosensitive chip 26 cannot be precisely aligned with the substrate 10. Consequently, the photosensitive chip 26 cannot correctly and completely receive image signals and the quality of the image sensor is influenced.

SUMMARY OF THE INVENTION

An object of the invention is to provide a mechanism for positioning a substrate of an image sensor, wherein a photosensitive chip may be precisely aligned with the substrate and the package yield may be improved.

To achieve the above-mentioned object, the invention provides a mechanism for positioning a substrate of an image sensor. The substrate has a first edge, a second edge, a third edge and a fourth edge. The mechanism includes:

- a standard unit having a first standard plane and a second standard plane perpendicular and adjacent to the first standard plane, the first standard plane and the second standard plane defining a positioning region in which the substrate is positioned, and the first edge and the second edge adjacent to the first edge contacting the first standard plane and the second standard plane, respectively;
- a link unit including a first link and a second link pivotally mounted to the first link at a pivotal portion for positioning the third edge of the substrate; and
- a push-up needle unit for positioning the fourth edge of the substrate, wherein when the link unit operates, the push-up needle unit and the pivotal portion of the link unit are moved toward the fourth edge and the third edge of the substrate, respectively, to position the substrate.

According to the above-mentioned mechanism, it is possible to precisely position the substrate so that a flame layer and a photosensitive chip may be precisely mounted to the substrate.

DETAILED DESCRIPTION OF THE INVENTION

Figure 1:
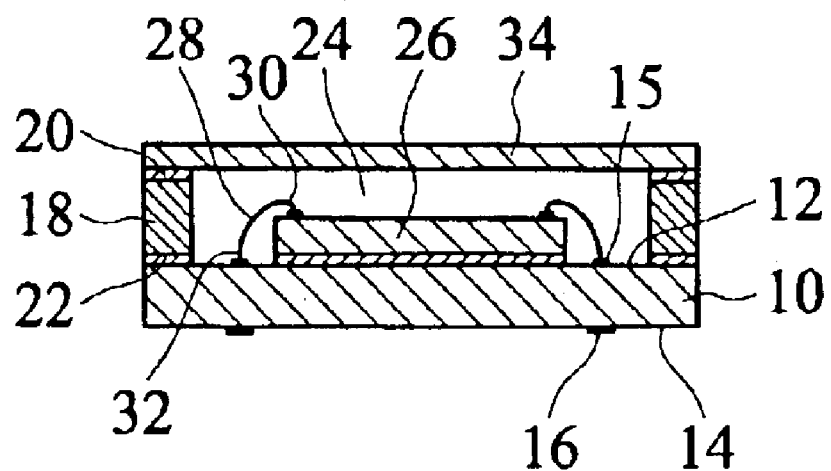
FIG. 1 is a schematic illustration showing a conventional image sensor.
Figure 6:
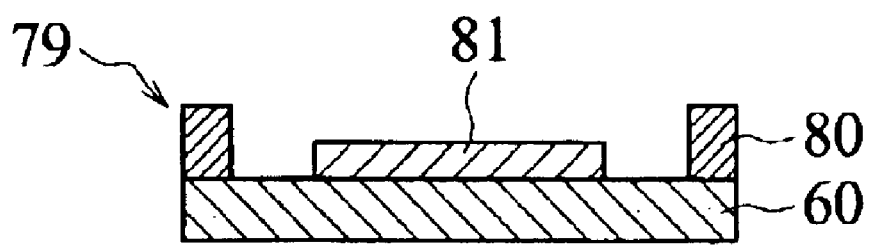
FIG. 6 is a schematic illustration showing an image sensor of the invention.
Figure 2:
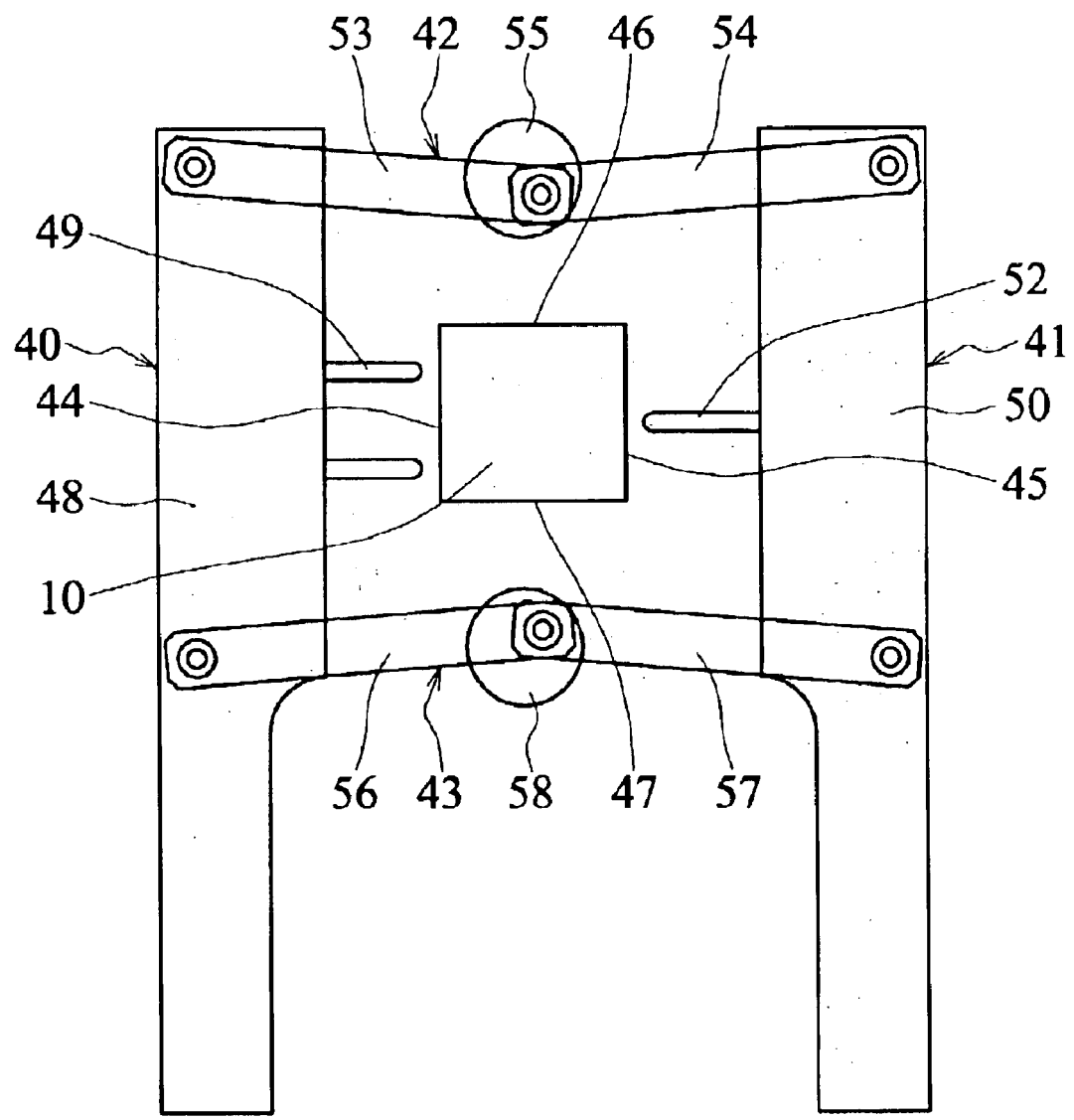
FIG. 2 is a first schematic illustration showing a conventional mechanism for positioning a substrate of an image sensor.
Figure 3:
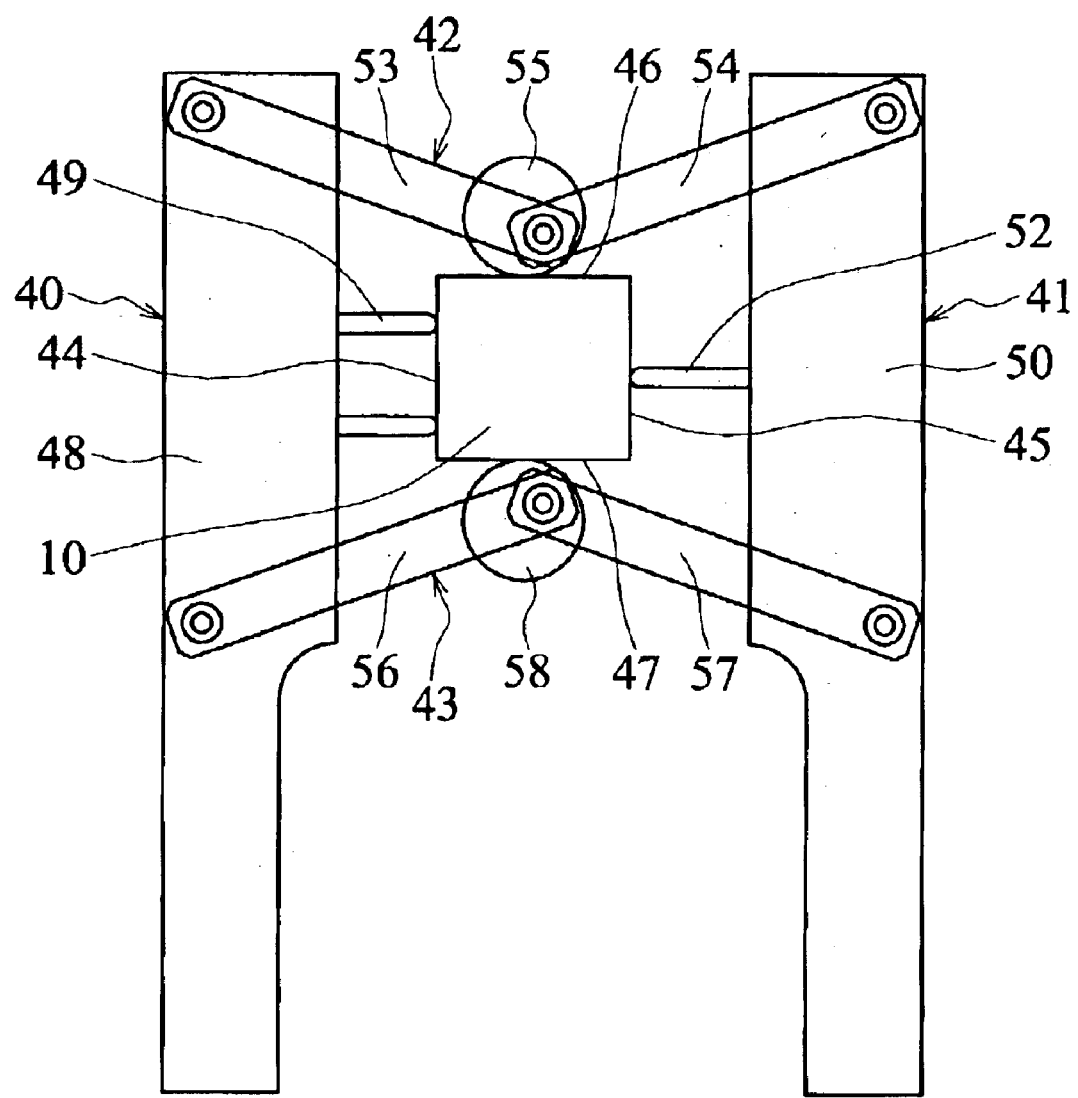
FIG. 3 is a second schematic illustration showing the conventional mechanism for positioning the substrate of the image sensor.
Figure 4:
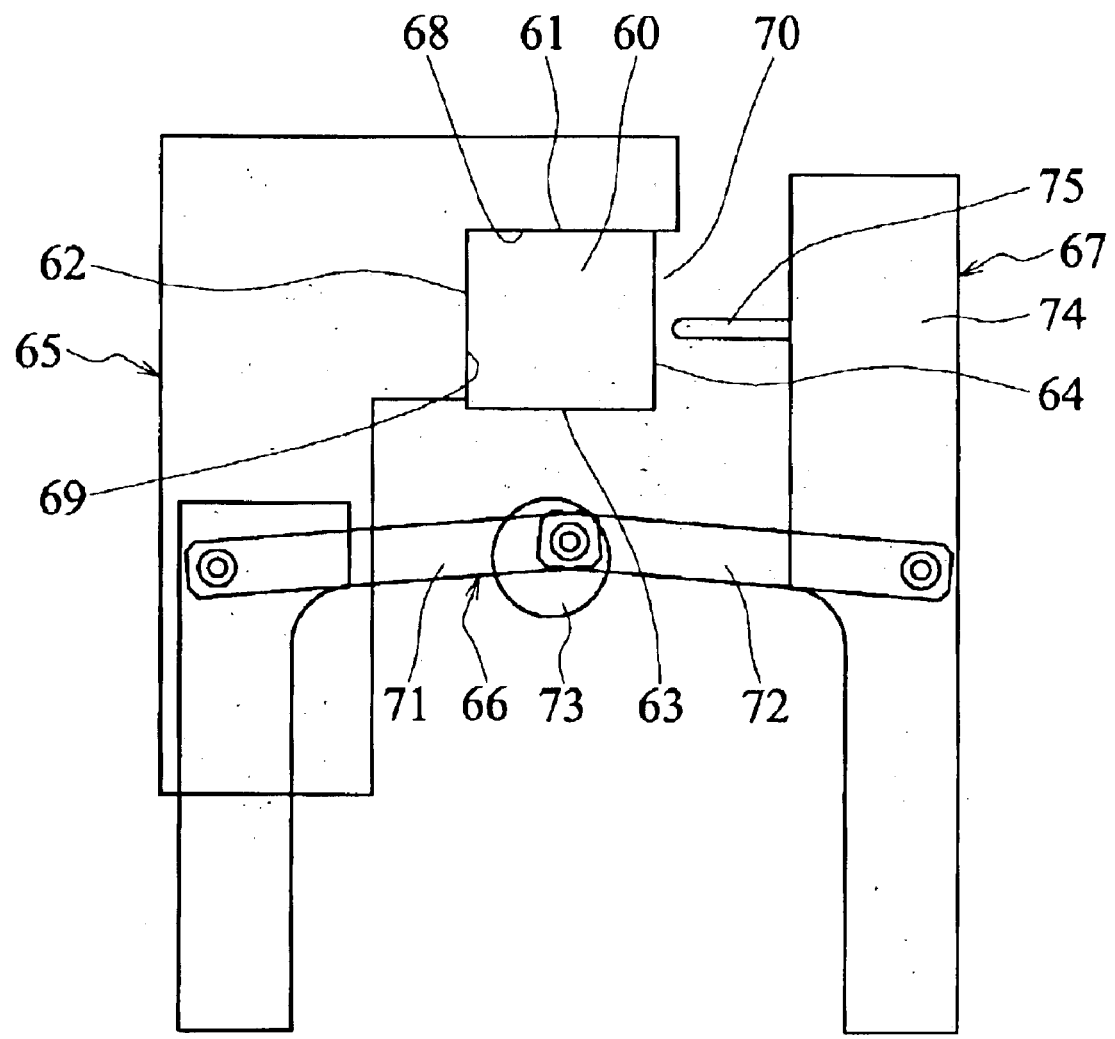
FIG. 4 is a first schematic illustration showing a mechanism for positioning a substrate of an image sensor of the invention.

Please refer to FIGS. 4 and 6. A mechanism for positioning a substrate of an image sensor of the invention is used to precisely position a first edge 61, a second edge 62, a third edge 63 and a fourth edge 64 of a substrate 60. Then, a frame layer 80 and a photosensitive chip 81 of an image sensor 79 may be precisely mounted to the substrate 60.

The positioning mechanism includes a standard unit 65, a link unit 66 and a push-up needle unit 67.

The standard unit 65 has a first standard plane 68 and a second standard plane 69 perpendicular and adjacent to the first standard plane 68. The first standard plane 68 and the second standard plane 69 define a positioning region 70 in which the substrate 60 may be positioned. The adjacent first edge 61 and second edge 62 of the substrate 60 may contact the first standard plane 68 and the second standard plane 69, respectively.

The link unit 66 includes a first link 71 and a second link 72 pivotally mounted to the first link 71. A first end of the first link 71 and a first end of the second link 72 are pivotally mounted at a pivotal portion, which is located at the third edge 63 of the substrate 60. A cam 73 is mounted to the pivotal portion to push the third edge 63 of the substrate 60. A second end of the first link 71 is pivotally mounted to the standard unit 65, and a second end of the second link 72 is pivotally mounted to the push-up needle unit 67.

The push-up needle unit 67 positions the fourth edge 64 of the substrate 60 and includes a third link 74 and a push-up needle 75 mounted to the third link 74. The second end of the second link 72 of the link unit 66 is pivotally mounted to the third link 74 so that the push-up needle 75 may push the fourth edge 64 of the substrate 60.

Figure 5:
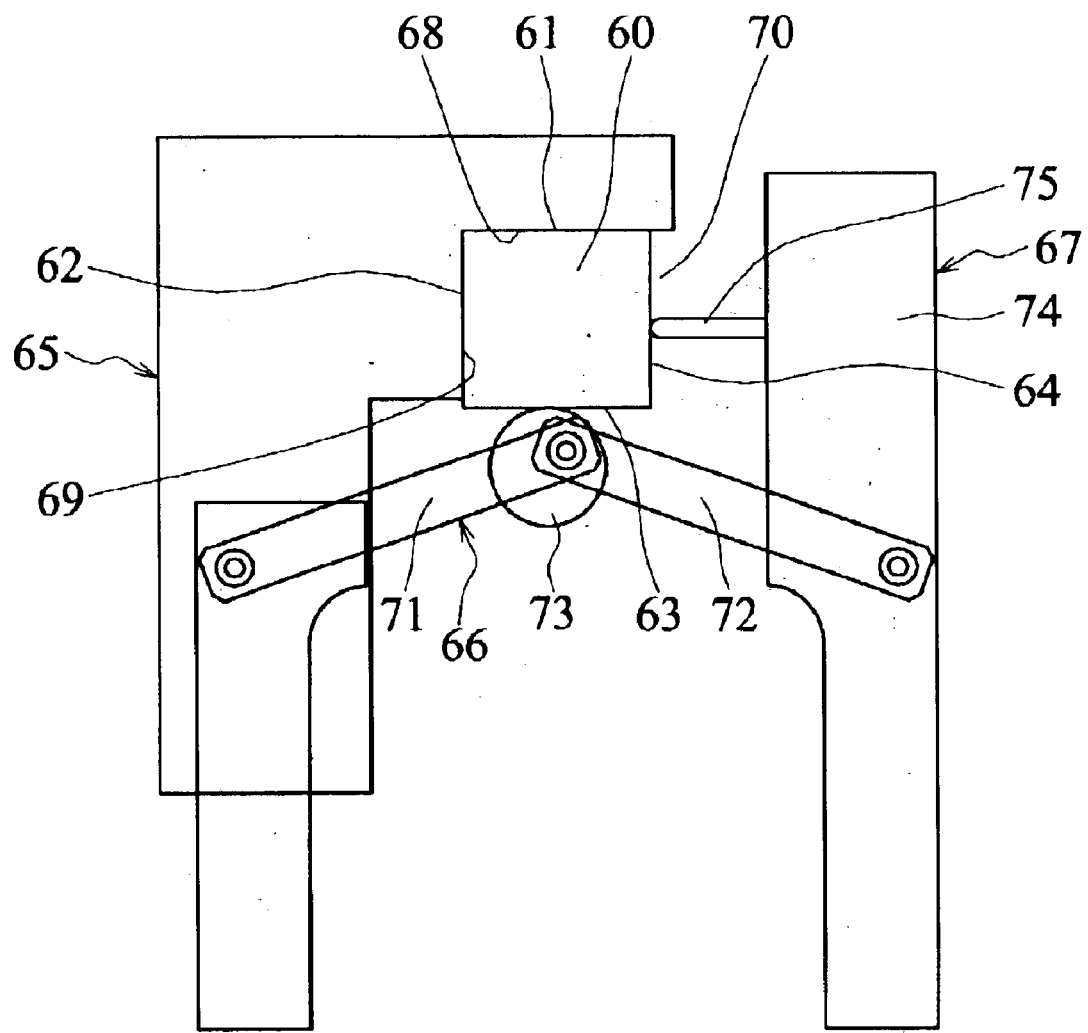
FIG. 5 is a second schematic illustration showing the mechanism for positioning the substrate of the image sensor of the invention.

As shown in FIG. 5, when the image sensor is packaged, the substrate 60 thereof is placed within the positioning region 70 of the standard unit 65. The substrate 60 is placed such that the first edge 61 contacts the first standard plane 68 and the second edge 62 contacts the second standard plane 69. When the link unit 66 is operated to move the cam 73 toward the third edge 63, the push-up needle unit 67 is simultaneously moved-toward the fourth edge 64. At this time, the push-up needle 75 and the cam 73 simultaneously push the fourth edge 64 and the third edge 63, respectively. Thus, the substrate 60 may be precisely positioned within the positioning region 70.

Then, as shown in FIG. 6, the frame layer 80 and the photosensitive chip 81 of the image sensor 79 may be precisely positioned on the substrate 60. At this time, it is possible to prevent the frame layer 80 and the photosensitive chip 81 from deviating from the substrate 60, and the package yield of the image sensor 79 may be increased.

While the invention has been described by way of an example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. A mechanism for positioning a substrate of an image sensor, the substrate having a first edge, a second edge, a third edge and a fourth edge, the mechanism comprising:

a standard unit having a first standard plane and a second standard plane perpendicular and adjacent to the first standard plane, the first standard plane and the second standard plane defining a positioning region in which the substrate is positioned, and the first edge and the second edge adjacent to the first edge contacting the first standard plane and the second standard plane, respectively;

a link unit including a first link and a second link pivotally mounted to the first link at a pivotal portion for positioning the third edge of the substrate; and a push-up needle unit for positioning the fourth edge of the substrate, wherein when the link unit operates, the push-up needle unit and the pivotal portion of the link unit are moved toward the fourth edge and the third edge of the substrate, respectively, to position the substrate.

2. The mechanism according to claim 1, further comprising a cam, which is mounted to the pivotal portion to push the third edge of the substrate.

3. The mechanism according to claim 1, wherein the first link has a first end pivotally mounted to the standard unit and a second end pivotally mounted to the second link, and the second link has a first end pivotally mounted to the first end of the first link and a second end pivotally mounted to the push-up needle unit.

4. The mechanism according to claim 1, wherein the push-up needle unit includes a third link and a push-up needle mounted to the third link to push the fourth edge of the substrate.

5. The mechanism according to claim 4, wherein the second link is pivotally mounted to the third link.

* * * * *